United States Patent
Shin et al.

(10) Patent No.: US 12,006,575 B2
(45) Date of Patent: *Jun. 11, 2024

(54) BARRIER FILM

(71) Applicant: LG CHEM, LTD., Seoul (KR)

(72) Inventors: Sung Jin Shin, Daejeon (KR); Jang Yeon Hwang, Daejeon (KR); Hee Joon Jeong, Daejeon (KR); Bo Ra Park, Daejeon (KR); Hee Wang Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 489 days.

This patent is subject to a terminal disclaimer.

(21) Appl. No.: 17/286,880

(22) PCT Filed: Oct. 22, 2019

(86) PCT No.: PCT/KR2019/013859
§ 371 (c)(1),
(2) Date: Apr. 20, 2021

(87) PCT Pub. No.: WO2020/085747
PCT Pub. Date: Apr. 30, 2020

(65) Prior Publication Data
US 2021/0381109 A1    Dec. 9, 2021

(30) Foreign Application Priority Data
Oct. 26, 2018 (KR) .......................... 10-2018-0128816

(51) Int. Cl.
C23C 18/12      (2006.01)
C08J 7/048      (2020.01)
(Continued)

(52) U.S. Cl.
CPC ............. *C23C 18/122* (2013.01); *C08J 7/048* (2020.01); *C08J 7/06* (2013.01); *C23C 16/34* (2013.01);
(Continued)

(58) Field of Classification Search
CPC ... H10K 50/844; H10K 50/8445; C08J 7/046; C08J 7/048; C23C 16/34; C23C 16/40;
(Continued)

(56) References Cited

U.S. PATENT DOCUMENTS 9,234,272 B2    1/2016  Naganawa et al.
9,359,505 B2    6/2016  Ii et al.
(Continued)

FOREIGN PATENT DOCUMENTS

CN      102470637 A    5/2012
CN      103582559 A    2/2014
(Continued)

OTHER PUBLICATIONS

Machine translation of JP 2009/196155 A, obtained from EspaceNet.*
(Continued)

*Primary Examiner* — Z. Jim Yang
(74) *Attorney, Agent, or Firm* — BRYAN CAVE LEIGHTON PAISNER LLP (57) ABSTRACT

Provided is a barrier film comprising a base layer, and an inorganic layer including Si, N, and O, and including a first region and a second region, which have different elemental contents (atomic %) of Si, N, and O from each other as measured by XPS, wherein the film has a water vapor transmission rate of $5.0 \times 10^{-4}$ g/m$^2$·day or less as measured under conditions of a temperature of 38° C. and 100% relative humidity after being stored at 85° C. and 85% relative humidity conditions for 250 hours, or wherein the inorganic layer has a compactness expressed through an (Continued)

etching rate of 0.17 nm/s in the thickness direction for an Ar ion etching condition to etch $Ta_2O_5$ at a rate of 0.09 nm/s. The barrier film has excellent barrier properties and optical properties and can be used for electronic products that are sensitive to moisture and the like.

13 Claims, 2 Drawing Sheets

(51) Int. Cl.
    *C08J 7/06*     (2006.01)
    *C23C 16/34*     (2006.01)
    *C23C 18/14*     (2006.01)
    *C23C 18/04*     (2006.01)
    *H10K 50/844*     (2023.01)

(52) U.S. Cl.
    CPC .......... *C23C 18/1233* (2013.01); *C23C 18/14* (2013.01); *C23C 18/04* (2013.01); *H10K 50/844* (2023.02)

(58) Field of Classification Search
    CPC ... C23C 16/308; C23C 16/345; C23C 16/401; C23C 14/0676; C23C 14/0652
    See application file for complete search history.

(56) References Cited

U.S. PATENT DOCUMENTS

| | | | |
|---|---|---|---|
| 9,437,594 B2 | 9/2016 | Yamazaki et al. | |
| 9,698,370 B2 | 7/2017 | Naganawa et al. | |
| 10,323,317 B2 | 6/2019 | Suzuki et al. | |
| 10,535,838 B2 | 1/2020 | Ito | |
| 10,654,070 B2 | 5/2020 | Yang et al. | |
| 2012/0107607 A1* | 5/2012 | Takaki | C08J 7/048 524/588 |
| 2013/0115423 A1* | 5/2013 | Ii | C08J 7/046 428/218 |
| 2013/0236710 A1* | 9/2013 | Honda | C08J 7/048 428/212 |
| 2013/0252002 A1* | 9/2013 | Suzuki | H01L 21/02274 428/448 |
| 2014/0106151 A1* | 4/2014 | Mori | C23C 18/143 427/515 |
| 2014/0199544 A1* | 7/2014 | Naganawa | C09D 183/16 428/336 |
| 2014/0322510 A1* | 10/2014 | Nishio | H05K 5/065 428/218 |
| 2014/0342149 A1 | 11/2014 | Naganawa et al. | |
| 2015/0030829 A1 | 1/2015 | Kenmochi et al. | |
| 2015/0064401 A1* | 3/2015 | Honda | B32B 27/00 428/447 |
| 2015/0099094 A1* | 4/2015 | Suzuki | C08J 7/044 428/141 |
| 2015/0099126 A1 | 4/2015 | Honda | |
| 2015/0132587 A1* | 5/2015 | Nishio | C23C 14/0036 428/447 |
| 2015/0194541 A1* | 7/2015 | Spagnola | B32B 27/286 427/407.1 |
| 2015/0209826 A1* | 7/2015 | Bordia | C23C 18/1208 427/377 |
| 2015/0284844 A1 | 10/2015 | Suzuki | |
| 2015/0287954 A1 | 10/2015 | Naganawa et al. | |
| 2015/0291813 A1* | 10/2015 | Nishio | C23C 16/455 106/287.34 |
| 2016/0053130 A1* | 2/2016 | Suzuki | B32B 27/26 427/487 |
| 2016/0056412 A1* | 2/2016 | Hirosawa | H10K 50/844 257/40 |
| 2016/0076133 A1* | 3/2016 | Suzuki | B32B 27/16 428/448 |
| 2016/0108282 A1* | 4/2016 | Ito | C09D 183/14 427/255.28 |
| 2016/0153089 A1* | 6/2016 | Goto | C23C 16/48 427/586 |
| 2016/0186009 A1* | 6/2016 | Goto | B05D 3/065 257/40 |
| 2016/0243801 A1* | 8/2016 | Okuyama | B32B 27/308 |
| 2016/0254487 A1* | 9/2016 | Harikrishna Mohan | C23C 28/02 428/213 |
| 2017/0107344 A1 | 4/2017 | Iwaya et al. | |
| 2017/0207415 A1* | 7/2017 | Ii | H10K 50/844 |
| 2017/0288170 A1* | 10/2017 | Ito | H10K 59/873 |
| 2017/0288171 A1* | 10/2017 | Ito | C23C 16/545 |
| 2018/0049281 A1* | 2/2018 | Hirosawa | H10K 50/844 |
| 2018/0237908 A1* | 8/2018 | Kato | C08J 7/0423 |
| 2018/0243789 A1 | 8/2018 | Yang et al. | |
| 2019/0001643 A1* | 1/2019 | Nakayama | C23C 18/143 |
| 2019/0058158 A1* | 2/2019 | Wei | H10K 59/873 |
| 2019/0081278 A1* | 3/2019 | Wittmann | H10K 50/15 |
| 2019/0106595 A1 | 4/2019 | Shin et al. | |
| 2019/0168492 A1* | 6/2019 | Iwase | C09D 4/00 |

FOREIGN PATENT DOCUMENTS

| | | |
|---|---|---|
| CN | 104023971 A | 9/2014 |
| CN | 105073406 A | 11/2015 |
| CN | 106457755 | 2/2017 |
| CN | 107331784 A | 11/2017 |
| CN | 108025528 A | 5/2018 |
| EP | 2455220 A1 | 5/2012 |
| EP | 2700500 A1 | 2/2014 |
| EP | 2777930 A1 | 9/2014 |
| EP | 2786808 A1 | 10/2014 |
| EP | 3127696 A1 | 2/2017 |
| JP | H08-112879 | 5/1996 |
| JP | H10-194873 | 7/1998 |
| JP | 2009-196155 | 9/2009 |
| JP | 2009196155 A * | 9/2009 |
| JP | 2010-208029 | 9/2010 |
| JP | 5082652 B2 * | 11/2012 |
| JP | 2014201032 A * | 10/2014 |
| JP | 5989002 | 9/2016 |
| JP | 6107819 | 4/2017 |
| JP | 6156366 | 7/2017 |
| JP | 2017-177640 | 10/2017 |
| JP | 2017-226876 | 12/2017 |
| JP | 2018-020540 | 2/2018 |
| JP | 2018-052041 | 4/2018 |
| KR | 10-2012-0031228 | 3/2012 |
| KR | 10-2013-0032370 | 4/2013 |
| KR | 10-2013-0106859 | 9/2013 |
| KR | 10-2014-0013972 | 2/2014 |
| KR | 10-2014-0016995 | 2/2014 |
| KR | 10-2014-0063518 | 5/2014 |
| KR | 10-2014-0089519 | 7/2014 |
| KR | 10-2014-0114337 | 9/2014 |
| KR | 10-2015-0058461 | 5/2015 |
| KR | 10-2015-0135521 | 12/2015 |
| KR | 10-2016-0101815 | 8/2016 |
| KR | 10-2016-0118467 | 10/2016 |
| KR | 10-2016-0138447 | 12/2016 |
| KR | 10-2017-0109372 | 9/2017 |
| KR | 10-2017-0113359 | 10/2017 |
| KR | 10-2017-0113443 | 10/2017 |
| KR | 10-2017-0113444 | 10/2017 |
| KR | 10-2017-0131440 | 11/2017 |
| TW | 201113152 | 4/2011 |
| TW | 201311441 | 3/2013 |
| TW | 201350340 | 12/2013 |
| TW | 201544329 | 12/2015 |
| TW | 201809332 | 3/2018 |
| WO | 2011-007543 | 1/2011 |
| WO | 2013-035432 | 3/2013 |
| WO | 2013-081003 | 6/2013 |
| WO | 2014-157685 | 10/2014 |
| WO | 2015-152077 | 10/2015 |
| WO | WO-2016136842 A1 * | 9/2016 ............. B32B 15/08 |

(56) References Cited

FOREIGN PATENT DOCUMENTS

| WO | WO-2017068938 A1 * | 4/2017 | ............. B32B 27/16 |
| WO | 2018-123724 | 7/2018 | |

OTHER PUBLICATIONS

Machine translation of JP 5082652 B2.*
Machine translation of JP 2014/201032 A.*
Office Action of Chinese Patent Office in Appl'n No. 201980069416. X, dated Jul. 13, 2022.
U.S. Appl. No. 17/287,207.
U.S. Appl. No. 17/286,562.
U.S. Appl. No. 17/285,189.
Office Action of Japanese Patent Office in Appl'n No. 2021-521131, dated May 9, 2022.
Extended Search Report of European Patent Office in Appl'n No. 19876372.4, dated Nov. 22, 2021.
Office Action of Japanese Patent Office in Appl'n No. 2021-522429, dated May 9, 2022.
Akemine et al., "Laminated sheet for electronic device e.g. solar cell, has layer A containing silicon, oxygen, and nitrogen on one side of substrate, where element ratio of oxygen and nitrogen satisfies predetermined equation in thickness direction," Database WPI, Week 201825, Thomson Scientific, London, GB, AN 2018-26163R, XP002804620, 2 pages (2018).
Office Action of Japanese Patent Office in Appl'n No. 2021-522429, dated Dec. 5, 2022.
International Search Report and the Written Opinion of PCT/KR2019/013859, mailed Jan. 30. 2020.
Search Report of Taiwanese Patent Office in Appl'n No. 108138601 dated May 28, 2020.
Office Action of Korean Office in Appl'n No. 10-2019-0128907, dated Mar. 29, 2021.

* cited by examiner

BARRIER FILM

CROSS-REFERENCE TO RELATED APPLICATIONS

This application is a National Stage Application of International Application No. PCT/KR2019/013859 filed on Oct. 22, 2019, which claims priority to and the benefit of Korean Patent Application No. 10-2018-0128816 filed on Oct. 26, 2018, the disclosure of which is incorporated herein by reference in its entirety.

TECHNICAL FIELD

The present application relates to a barrier film. In particular, the present application relates to a barrier film having excellent barrier properties against foreign substances such as oxygen or moisture.

BACKGROUND

Barrier films for blocking external components such as oxygen and moisture are used not only for packaging materials of foods or medicines, and the like which are conventional main applications, but also members for FPDs (flat panel displays) such as LCDs (liquid crystal displays) or solar cells, substrates for electronic papers or OLEDs (organic light emitting diodes) or sealing films, and the like. In particular, in the case of barrier films used in electrical or electronic elements, resistance to moist heat that barrier properties do not deteriorate even after being left in moist-heat conditions from the viewpoint of ensuring the performance of the apparatuses is also required, in addition to high barrier properties against oxygen or moisture, and the like.

The method for producing a barrier film can include, for example, a wet method. Specifically, the barrier film can be produced through a method of converting polysilazane coated on a base film into silica. At this time, the polysilazane can be converted to silica while undergoing a process such as heating under a predetermined condition or hydrolysis. For example, Japanese Patent Laid-Open Publication No. H10-194873 discloses a method of applying perhydropolysilazane or its modified product to a base film and firing it under vacuum.

DISCLOSURE

Technical Problem

It is one object of the present application to provide a barrier film having excellent barrier properties against foreign substances such as oxygen or moisture.

It is another object of the present application to provide a barrier film which does not deteriorate barrier properties against foreign substances such as oxygen or moisture even after being stored at high temperature and/or high humidity conditions.

It is another object of the present application to provide a packaging material, apparatus or device comprising the barrier film.

The above objects of the present application and other objects can all be solved by the present application described in detail below.

Technical Solution

In one example of the present application, the present application relates to a barrier film. In the present application, the barrier film means a film that satisfies the intended light transmittance and barrier properties.

With regard to light transmittance, the barrier film can mean a film having light transmittance of 90% or more, or 95% or more for visible light in a wavelength range of 380 to 780 nm, specifically, light having a wavelength of 550 nm. The upper limit of the transmittance is, for example, about 100%, where the film can have transmittance of less than 100%.

With regard to the barrier properties, the barrier film can have a good water vapor transmission rate.

In one example, the barrier film can satisfy a water vapor transmission rate of $10 \times 10^{-4}$ $g/m^2 \cdot day$ or less as measured at a temperature of 38° C. and 100% relative humidity. More specifically, the barrier film can have a water vapor transmission rate of $9 \times 10^{-4}$ $g/m^2 \cdot day$ or less, $8 \times 10^{-4}$ $g/m^2 \cdot day$ or less, $7 \times 10^{-4}$ $g/m^2 \cdot day$ or less, $6 \times 10^{-4}$ $g/m^2 \cdot day$ or less, $5 \times 10^{-4}$ $g/m^2 \cdot day$ or less, $4 \times 10^{-4}$ $g/m^2 \cdot day$ or less, $3 \times 10^{-4}$ $g/m^2 \cdot day$ or less, $2 \times 10^{-4}$ $g/m^2 \cdot day$ or less, or $1 \times 10^{-4}$ $g/m^2 \cdot day$ or less, as measured under the above conditions. The lower the water vapor transmission rate is, the better the barrier property is, and thus the lower limit of the water vapor transmission rate is not particularly limited. In one example, the lower limit of the water vapor transmission rate can be $0.001 \times 10^{-4}$ $g/m^2 \cdot day$ or more, $0.005 \times 10^{-4}$ $g/m^2 \cdot day$ or more, $0.01 \times 10^{-4}$ $g/m^2 \cdot day$ or more, $0.05 \times 10^{-4}$ $g/m^2 \cdot day$ or more, $0.1 \times 10^{-4}$ $g/m^2 \cdot day$ or more, or $0.5 \times 10^{-4}$ $g/m^2 \cdot day$ or more. As a representative standard for measuring the water vapor transmission rate, ASTM F1249 or ISO15506-3, and the like is known, where the water vapor transmission rate of the present application can be measured according to the appropriate manner among the forgoing.

In one example, the barrier film can satisfy a water vapor transmission rate of a predetermined value as measured after being stored under severe conditions. Specifically, the barrier film of the present application can satisfy a water vapor transmission rate of $5.0 \times 10^{-4}$ $g/m^2 \cdot day$ or less as measured at a temperature of 38° C. and 100% relative humidity after storing the film at 85° C. and 85% relative humidity conditions for 250 hours. More specifically, the barrier film can have a water vapor transmission rate of $4.5 \times 10^{-4}$ $g/m^2 \cdot day$ or less, $4.0 \times 10^{-4}$ $g/m^2 \cdot day$ or less, $3.5 \times 10^{-4}$ $g/m^2 \cdot day$ or less, $3.0 \times 10^{-4}$ $g/m^2 \cdot day$ or less, $2.5 \times 10^{-4}$ $g/m^2 \cdot day$ or less, $2.0 \times 10^{-4}$ $g/m^2 \cdot day$ or less, $1.5 \times 10^{-4}$ $g/m^2 \cdot day$ or less, or $1.0 \times 10^{-4}$ $g/m^2 \cdot day$ or less, as measured under the above conditions. The lower the water vapor transmission rate is, the better the barrier properties are, and thus the lower limit of the water vapor transmission rate is not particularly limited. In one example, the lower limit of the water vapor transmission rate can be $0.001 \times 10^{-4}$ $g/m^2 \cdot day$ or more, $0.005 \times 10^{-4}$ $g/m^2 \cdot day$ or more, $0.01 \times 10^{-4}$ $g/m^2 \cdot day$ or more, $0.05 \times 10^{-4}$ $g/m^2 \cdot day$ or more, $0.1 \times 10^{-4}$ $g/m^2 \cdot day$ or more, or $0.5 \times 10^{-4}$ $g/m^2 \cdot day$ or more. The water vapor transmission rate is measured at a temperature of 38° C. and 100% relative humidity after exposing the barrier film to be measured at 85° C. and 85% relative humidity conditions for 250 hours, whereby these conditions can be seen as more severe conditions than high humidity conditions such as, for example, conditions of a temperature of 38° C. and 100% relative humidity, or high temperature/high humidity conditions such as, for example, 85° C. and 85% relative humidity conditions. That is, the barrier film of the present application can maintain high barrier properties even under more severe conditions.

The barrier film of the present application that satisfies the light transmittance and barrier properties in the above-described range comprises a base layer and an inorganic layer. The inorganic layer comprises Si, N, and O.

The base layer can comprise, for example, glass or a polymer film capable of providing light transmittance.

In one example, the base layer can comprise a polymer film capable of providing sufficient flexibility. For example, as the base layer, a polyester film such as a polyethylene terephthalate (PET) film, a polycarbonate film, a polyethylene naphthalate film or a polyarylate film, a polyether film such as a polyether sulfone film, a cycloolefin polymer film, a polyolefin film such as a polyethylene film or a polypropylene film, a cellulose resin film such as a diacetyl cellulose film, a triacetyl cellulose film or an acetyl cellulose butyrate film, a polyimide film, an acryl film and an epoxy resin film, and the like can be used. In the present application, the base layer can have a single layer or a multilayer structure.

The thickness of the base layer is not particularly limited. For example, the thickness of the base layer can be about 1 μm or more, 5 μm or more, 10 μm or more, 20 μm or more, 30 μm or more, 40 μm or more, or 50 μm or more. When the thickness is satisfied, the inorganic layer can be stably formed on the base layer. The upper limit of the base layer thickness is not particularly limited, but can be, for example, 500 μm or less, 400 μm or less, 300 μm or less, 200 μm or less, or 100 μm or less.

The inorganic layer can be formed through plasma modification of the polysilazane composition, that is, the polysilazane layer, applied on an adherend for coating (for example, the base layer).

In the present application, the polysilazane composition means a composition comprising polysilazane as a main component. For example, the ratio of the polysilazane in the polysilazane composition can be 55% or more, 60% or more, 65% or more, 70% or more, 75% or more, 80% or more, 85% or more, or 90% or more on the basis of weight. The weight ratio can be, for example, 100% or less, 99% or less, 98% or less, 97% or less, 96% or less, or 95% or less.

In the present application, the polysilazane can mean a polymer in which silicon elements (Si) and nitrogen elements (N) are repeated to form a basic backbone. This polysilazane can be modified through a predetermined treatment (for example, plasma treatment) to form silicon oxide or silicon oxynitride having barrier properties. Accordingly, the inorganic layer can comprise Si, N, and O.

In one example, the polysilazane used in the present application can comprise a unit of Formula 1 below:

Formula 1

In Formula 1, $R^1$, $R^2$ and $R^3$ can each independently be a hydrogen element, an alkyl group, an alkenyl group, an alkynyl group, an aryl group, an alkylsilyl group, an alkylamino group or an alkoxy group.

In the present application, the term "alkyl group" means an alkyl group having 1 to 20 carbon atoms, 1 to 16 carbon atoms, 1 to 12 carbon atoms, 1 to 8 carbon atoms or 1 to 4 carbon atoms, unless otherwise specified. The alkyl group can be linear, branched or cyclic. In addition, the alkyl group can be optionally substituted with one or more substituents.

In the present application, the term "alkenyl group" means an alkenyl group having 2 to 20 carbon atoms, 2 to 16 carbon atoms, 2 to 12 carbon atoms, 2 to 8 carbon atoms, or 2 to 4 carbon atoms, unless otherwise specified. The alkenyl group can be linear, branched or cyclic and can optionally be substituted with one or more substituents.

In the present application, the term "alkynyl group" means an alkynyl group having 2 to 20 carbon atoms, 2 to 16 carbon atoms, 2 to 12 carbon atoms, 2 to 8 carbon atoms, or 2 to 4 carbon atoms, unless otherwise specified. The alkynyl group can be linear, branched or cyclic and can optionally be substituted with one or more substituents.

In the present application, the term "aryl group" means a monovalent residue derived from a compound comprising a structure in which a benzene ring or two or more benzene rings are linked, or condensed or bonded while sharing one or two or more carbon elements, or a derivate thereof, unless otherwise specified. In this specification, the range of the aryl group can also include a so-called aralkyl group or an arylalkyl group, and the like as well as a functional group usually referred to as an aryl group. The aryl group can be, for example, an aryl group having 6 to 25 carbon atoms, 6 to 21 carbon atoms, 6 to 18 carbon atoms, or 6 to 12 carbon atoms. As the aryl group, a phenyl group, a dichlorophenyl group, a chlorophenyl group, a phenylethyl group, a phenylpropyl group, a benzyl group, a tolyl group, a xylyl group or a naphthyl group, and the like can be exemplified.

In the present application, the term "alkoxy group" means an alkoxy group having 1 to 20 carbon atoms, 1 to 16 carbon atoms, 1 to 12 carbon atoms, 1 to 8 carbon atoms or 1 to 4 carbon atoms, unless otherwise specified. The alkoxy group can be linear, branched or cyclic. In addition, the alkoxy group can be optionally substituted with one or more substituents.

If the unit of Formula 1 above is included, the specific kind of the polysilazane is not particularly limited.

In one example, the polysilazane can be polysilazane including the unit of Formula 1 in which all of $R^1$ to $R^3$ are hydrogen atoms, for example, perhydropolysilazane.

In one example, the polysilazane layer composition can be prepared, for example, by dissolving polysilazane in an appropriate organic solvent. For example, the polysilazane can be a commercially available product in a state dissolved in an organic solvent. Such a commercially available product can include, for example, AQUAMICA (registered trademark) NN120-10, NN120-20, NAX120-10, NAX120-20, NN110, NN310, NN320, NL110A, NL120A, NL150A, NP110, NP140, or SP140, and the like, manufactured by AZ Electronic Materials Kabushiki Kaisha (or Merck), but is not limited thereto.

In another example, the polysilazane layer composition can be a composition diluted to a predetermined concentration. The diluted concentration is not particularly limited, and for example, the weight ratio of total solid content can range from 1 to 95%. In one example, the composition can have a weight ratio of total solid content of 1 to 10% or less.

In the present application, the layer formed from the polysilazane, that is, the inorganic layer has enough durability and compactness capable of satisfying the water vapor transmission rate. In the present application, the compactness can be expressed through an etching rate. For example, the inorganic layer can have an etching rate satisfying a predetermined value with respect to a reference condition. In the present application, the term "etching rate" means a value obtained by dividing an etched thickness (unit: nm) by an etching progress time (unit: second) on the assumption that etching is performed under the same conditions as the reference conditions described below. The etching for measuring the etching rate is so-called dry etching, which is the etching using a plasma state of reactive gas. Ar is used as the reactive gas.

Regarding the etching rate of the inorganic layer, the inventors of the present application have confirmed that even if a similar inorganic layer is formed from the polysilazane to include Si, N and O, so that its constituent elements are similar, the degree of firmness or compactness in the layer can vary depending on the contents of elements forming the inorganic layer in the thickness direction of the inorganic layer, the change in distribution tendency, and/or the conditions for forming the inorganic layer, and consequently, the etching rate with respect to the reference condition can also vary. Specifically, in the prior art related to the barrier film, the type of the elements in the inorganic layer or the contents of the elements expressed as numerical values have been mainly considered as an important factor for determining the barrier properties, but the compactness of the inorganic layer can vary depending on the contents of the elements forming the inorganic layer, the change in distribution tendency, and/or the conditions for forming the inorganic layer, and consequently, the water vapor transmission rate of the barrier film can be significantly improved.

Specifically, the inorganic layer can satisfy an etching rate of 0.17 nm/s or less for a reference condition, that is, an Ar ion etching condition to etch $Ta_2O_5$ (film) at a rate of 0.09 nm/s or less. The etching rate can indicate the degree of compactness in the inorganic layer. That is, the inorganic layer having the etching rate can be considered to have a more dense structure than the inorganic layer that does not satisfy the etching rate, for example, as in the case where the etching rate is 0.19 nm/s. For example, the inorganic layer can have an etching rate of 0.165 nm/s or less, 0.160 nm/s or less, 0.155 nm/s or less, 0.150 nm/s or less, 0.145 nm/s or less, 0.140 nm/s or less, 0.135 nm/s or less, 0.130 nm/s or less, 0.125 nm/s or less, or 0.120 nm/s or less for the above condition. When the etching rate range is satisfied, it can be regarded as being sufficiently dense, and thus the lower limit of the etching rate is not particularly limited, but can be, for example, 0.05 nm/s or more, or 0.10 nm/s or more.

The inorganic layer comprises a first region and a second region. In the present application, the first region is in a position that is closer to the base layer than the second region.

In the present application, the first region and the second region constituting one inorganic layer have different elemental contents (atomic %) of Si, N, and O from each other as analyzed or measured by XPS (X-ray photoelectron spectroscopy) in the thickness direction. That is, the first region and the second region can be distinguished due to the difference in the elemental content distribution of Si, N, and O. For example, the elemental content of each region can be analyzed according to the etching depth in the thickness direction of the inorganic layer, where in the case that a flat section is observed or in the case that a section is observed, in which the magnitude tendency in the content of each element is common, the median or average value of the respective elemental contents in the corresponding section can be seen as the elemental content (range) in the region, because the degree of change in the content of each element with the depth is relatively small. Then, the elemental content at the interface between the first region and the second region can be changed continuously or stepwise in relation to the distinction of the regions according to the elemental contents, and as a result of these content changes, it is sufficient to distinguish the first region and the second region as long as the region satisfying the elemental content ratio defined by each region is observed, and the interface between the first region and the second region does not necessarily need to be clearly distinguished. This distinction can be clearly made by those skilled in the art through an elemental content distribution graph according to the etching depth identified using XPS.

The first region and the second region can have the compactness as described above. Specifically, the first region and/or the second region can each be a region where the etching rate measured under the Ar ion etching condition etching $Ta_2O_5$ at a rate of 0.09 nm/s satisfies 0.17 nm/s or less. For example, the first region and/or the second region can satisfy an etching rate of 0.165 nm/s or less, 0.160 nm/s or less, 0.155 nm/s or less, 0.150 nm/s or less, 0.145 nm/s or less, 0.140 nm/s or less, 0.135 nm/s or less, 0.130 nm/s or less, 0.125 nm/s or less, or 0.120 nm/s or less for the reference condition. The lower limit of the etching rate of the first region and/or the second region is not particularly limited, but can be, for example, 0.05 nm/s or more or 0.10 nm/s or more.

In one example, the first region can be a region satisfying the relationship O content>Si content>N content. That is, the first region means a region that satisfies such elemental contents.

In the present application, the content of the element is a value at the time of regarding the sum of the contents of Si, O and N, and optionally the content of impurities (for example: C) that can be measured in each layer or region as 100 in total. Unless specifically stated otherwise, the content of C is a value excluding the contents of Si, O and N, and thus it can be omitted.

Specifically, in the first region, the O content can be in a range of 50 to 65 atomic %, the Si content can be in a range of 35 to 45 atomic %, and the N content can be in a range of 1 to 15 atomic %. It is believed that such elemental contents can secure the compactness of the inorganic layer expressed by the above-described etching rate, and can improve the moisture barrier properties of the barrier film.

In one example, the first region can satisfy a ratio (a/b) of the O content (a) to the Si content (b) in a range of 1.1 to 1.9. Preferably, it can be 1.2 or more, 1.3 or more, or 1.4 or more. In the first region where the contents of Si, N and O satisfy the above ranges, when the ratio (a/b) value is in the range of 1.1 to 1.9, it is believed that the compactness of the inorganic layer represented by the above-described etching rate can be secured and the moisture barrier properties of the barrier film can be improved.

In one example, the thickness of the first region satisfying the elemental content ratio can be 40 nm or more. When the thickness of the first region satisfies the above range, the inorganic layer or the first region can have sufficient compactness while being stably formed and can provide the barrier film with higher durability. For example, since the base layer adjacent to the first region or the intermediate layer described below can have predetermined roughness on its surface, the first region can have a minimum thickness so that the inorganic layer can be stably formed. More specifically, the thickness of the first region satisfying the elemental content can be, for example, 45 nm or more, 50 nm or more, 55 nm or more, 60 nm or more, 65 nm or more, 70 nm or more, 75 nm or more, 80 nm or more, 85 nm or more, 90 nm or more, 95 nm or more, or 100 nm or more. The upper limit of the thickness of the first region is not particularly limited, but can be, for example, 300 nm or less, 250 nm or less, or 200 nm or less.

In one example, the second region can be a region that satisfies the relationship Si content>N content>O content. That is, the second region means a region that satisfies such elemental contents. As a result of the experimental confirmation, the case where the second region satisfied the relationship Si content>N content>O content could more increase the compactness of the inorganic layer and better adjusted the barrier properties of the film than the case where it had Si content>O content>N content.

Specifically, in the second region, the Si content can be in a range of 45 to 60 atomic %, the N content can be in a range of 20 to 35 atomic %, and the O content can be in a range of 10 to 30 atomic %. Such elemental contents are considered to be advantageous in ensuring the compactness of the inorganic layer expressed by the above-described etching rate.

In one example, the thickness of the second region satisfying the elemental content ratio can be 10 nm or more, 20 nm or more, 30 nm or more, 40 nm or more, or 50 nm or more. The upper limit thereof is not particularly limited, but can be, for example, about 250 nm or less or about 200 nm or less. As confirmed in the following experimental example, the thickness of the second region, which is a high nitrogen concentration region, seems to have an effect on improving the barrier properties of the film, and when the thickness range is satisfied, the barrier film can also be formed to a thin thickness of an appropriate level and simultaneously excellent barrier properties to the thickness can be provided. More specifically, the thickness of the second region satisfying the elemental content can be, for example, 190 nm or less, 185 nm or less, 180 nm or less, 175 nm or less, 170 nm or less, 165 nm or less, 160 nm or less, 155 nm or less, 150 nm or less, 145 nm or less, 140 nm or less, or 135 nm or less.

In one example, the difference (d) between the maximum value of the second region Si content and the maximum value of the first region O content can be 15 atomic % or less. In each region where the contents of Si, N and O satisfy the above ranges, when the difference (d) is satisfied, it is believed that the compactness of the inorganic layer represented by the above-described etching rate can be ensured and the moisture barrier properties of the barrier film can be improved.

In one example, the second region can be a high nitrogen concentration region in the inorganic layer. That is, the second region can be a region having a higher nitrogen content than that of the first region. The inventors of the present application have confirmed that the thicker the second region, which is the high nitrogen concentration region, the better the water vapor transmission rate, on the assumption that the compactness of the inorganic layer identified through the etching rate is secured, like the etching rate for the reference condition is 0.17 nm/s or less. This result is confirmed through the following experimental example.

In one example, the thickness of the second region can have a thickness of 10% or more, relative to the thickness of the entire inorganic layer. For example, the thickness of the second region can be 15% or more, 20% or more, 25% or more, 30% or more, 35% or more, 40% or more, 45% or more, 50% or more, 55% or more, 60% or more, 65% or more, or 70% or more, based on the thickness of the entire inorganic layer. For example, when the thickness of the inorganic layer is 150 nm, the thickness of the second region can be 15 nm or more, 16 nm or more, 17 nm or more, 19 nm or more, or 20 nm or more. In this case, the thickness of the second region can also be 200 nm or less.

The formation of the first region and the second region can be performed through a plasma treatment of a composition comprising polysilazane, that is, a polysilazane layer.

In one example, the first region and the second region can be regions in the inorganic layer formed through one plasma treatment performed on one coated polysilazane composition, that is, one polysilazane layer. That is, the inorganic layer can be partitioned into the first region and the second region formed therein. It is believed that while the N-rich second region is formed through the plasma treatment, it is divided into the first region and the second region.

Figure 1:
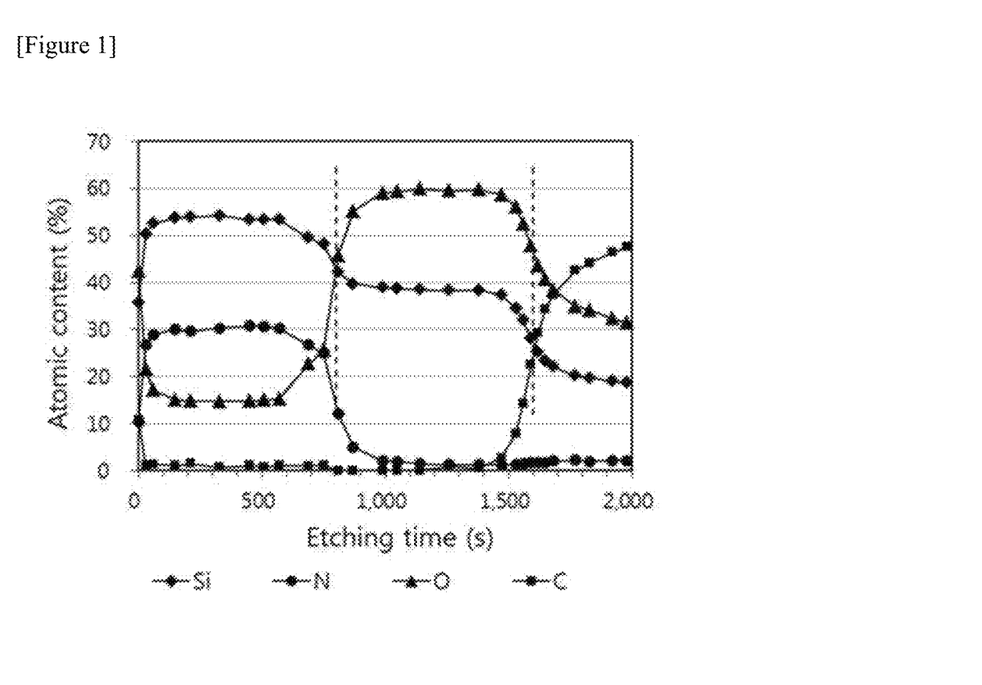
FIG. 1 shows the XPS analysis results for the inorganic layer of Example 4.
Figure 2:
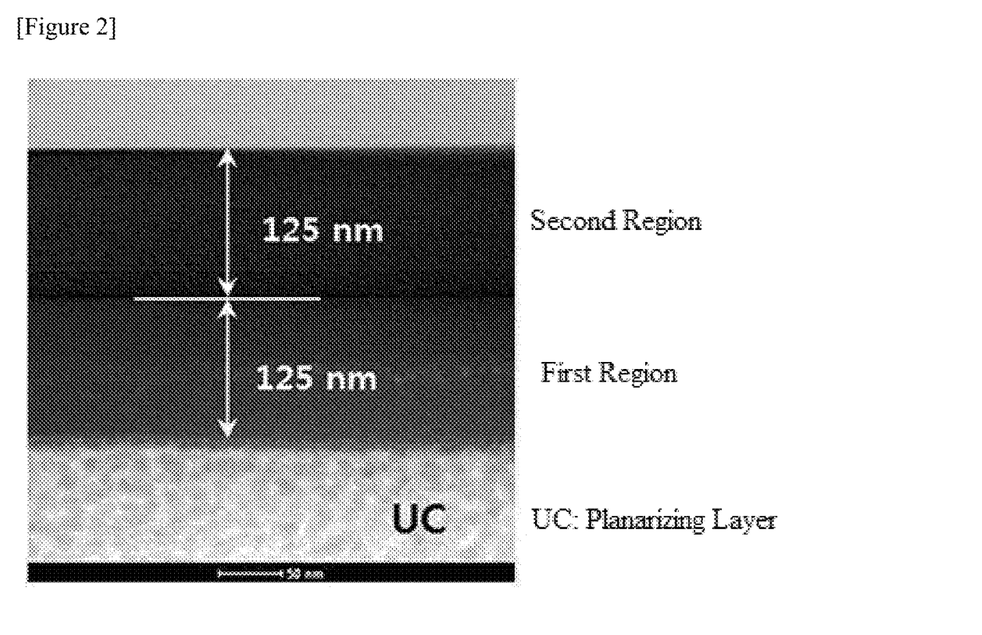
FIG. 2 is a view obtained by TEM analyzing the cross section of the barrier film of Example 4.
Figure 3:
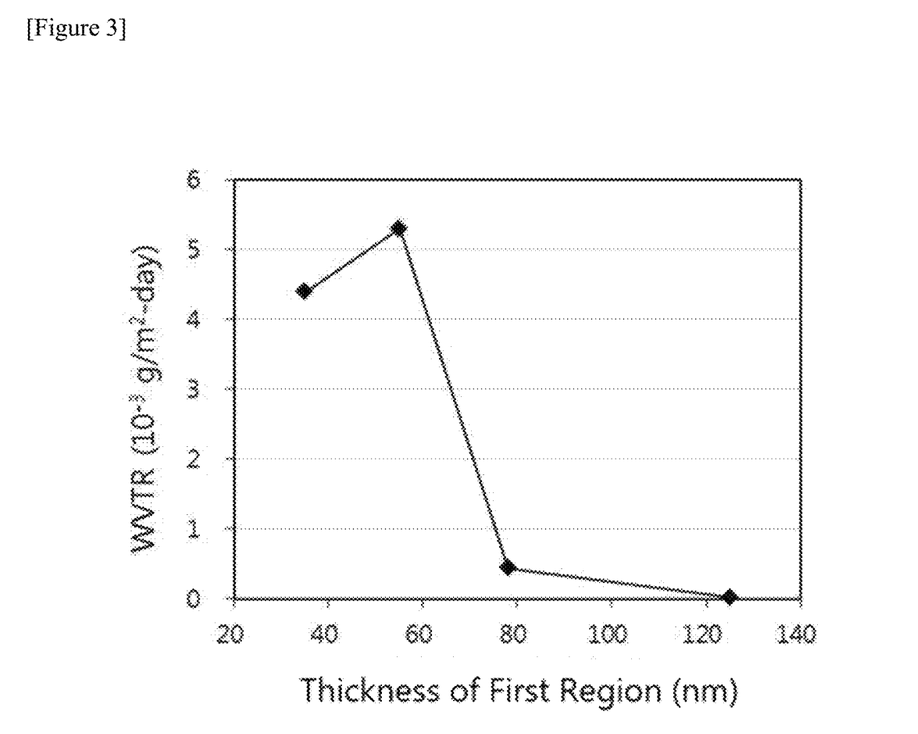
FIG. 3 shows, in connection with Experimental Example 2, the relationship between the thickness of the first region and the water vapor transmission rate measured under Condition 2.

In another example, the first region and the second region can be adjacent regions formed through the plasma treatment on polysilazane layers different from each other. For example, the first region can be a region formed through the plasma treatment on a polysilazane layer (A), and the second region can be a region formed the plasma treatment on a polysilazane layer (B) applied on the inorganic layer on which the first region is formed. These first region and second region comprise Si, N, and O, and constitute an inorganic layer. As described above, the N-rich region is placed on the surface layer portion of the plasma-treated polysilazane layer through the plasma treatment, which is the same as the case of the plasma-treated polysilazane layer (A), whereby it is believed that even if a separate plasma treatment is performed on the polysilazane layer (B), a second region having the same elemental content distribution as that of the surface layer portion of the polysilazane layer (A) is formed. In this case, the interfaces of the respective plasma-treated polysilazane layers (A, B) can be observed as a section where elemental content changes occur between the first region and the second region, for example, as in FIG. 1. As confirmed in Examples 1 to 5 below, when the inorganic layer is formed in this manner, it is possible to ensure a larger thickness of the second region, whereby the barrier properties can be improved while the high nitrogen concentration region in the inorganic layer increases.

In one example, a modified layer having a high content of carbon can be present between the inorganic layer and the base layer. The modified layer can be an interface between the plasma-treated inorganic layer and the base layer. Alternatively, the modified layer can be an interface between the plasma-treated inorganic layer and an intermediate layer described below. The modified layer can be a region containing more carbon than the first region and the second region. For example, the modified layer can be a region that satisfies the relationship C content>O content>Si content>N content.

Specifically, in the modified layer, the C content can be in a range of 40 to 50 atomic %, the O content can be in a range of 30 to 40 atomic %, the Si content can be in a range of 15 to 30 atomic %, and the N content can be in a range of 1 to 5 atomic %.

The thickness of the inorganic layer having the first region and the second region can be, for example, 600 nm or less, or 500 nm or less. More specifically, the thickness of the inorganic layer can be 450 nm or less, 400 nm or less, 350 nm or less, 300 nm or less, 250 nm or less, or 200 nm or less. The inorganic layer of the above-described configuration can have sufficient barrier properties even at a thin thickness. The lower limit of the thickness of the inorganic layer is not particularly limited, but can be, for example, 50 nm or more.

In one example, the barrier film can further comprise an intermediate layer. Specifically, the barrier film can sequentially comprise a base layer, an intermediate layer, and an inorganic layer. The intermediate layer can be formed for the purpose of improving adhesion force between the inorganic layer and the base layer, controlling a dielectric constant, and the like. The intermediate layer can be referred to as an under coating layer (UC).

The intermediate layer can comprise at least one selected from the group consisting of an acrylic resin, a urethane resin, a melamine resin, an alkyd resin, an epoxy resin, a siloxane polymer and/or a condensation product of an organosilane compound of the following Formula 2:

Formula 2

In Formula 2, X can be hydrogen, halogen, an alkoxy group, an acyloxy group, an alkyl carbonyl group, an alkoxycarbonyl group, or $-N(R_2)_2$, where $R_2$ can be hydrogen or an alkyl group, $R_1$ can be an alkyl group, an alkenyl group, an alkynyl group, an aryl group, an arylalkyl group, an alkylaryl group, an arylalkenyl group, an alkenylaryl group, an arylalkynyl group, an alkynylaryl group, halogen, an amino group, an amide group, an aldehyde group, an alkylcarbonyl group, a carboxyl group, a mercapto group, a cyano group, a hydroxy group, an alkoxy group, an alkoxycarbonyl group, a sulfonyl group, a phosphoryl group, an acryloyloxy group, a methacryloyloxy group or an epoxy group, Q can be a single bond, an oxygen element or $-N(R_2)-$, where $R_2$ can be a hydrogen element or an alkyl group, and m can be a number in a range of 1 to 3.

As the organosilane, at least one selected from the group consisting of the compounds of Formula 2 above can be used, where if one organosilane compound is used, cross-linking can be possible.

The organosilane can be selected, as an example, from the group consisting of methyl trimethoxysilane, methyl triethoxysilane, phenyl trimethoxysilane, phenyl triethoxysilane, dimethyl dimethoxysilane, dimethyl diethoxysilane, diphenyl dimethoxysilane, diphenyl diethoxysilane, phenyl dimethoxysilane, phenyl diethoxysilane, methyl dimethoxysilane, methyl diethoxysilane, phenylmethyl dimethoxysilane, phenylmethyl diethoxysilane, trimethyl methoxysilane, trimethyl ethoxysilane, triphenyl methoxysilane, triphenyl ethoxysilane, phenyldimethyl methoxysilane, phenyldimethyl ethoxysilane, diphenylmethyl methoxysilane, diphenylmethyl ethoxysilane, dimethyl ethoxysilane, diphenyl methoxysilane, diphenyl ethoxysilane, 3-aminopropyl triethoxysilane, 3-glycidoxypropyl trimethoxysilane, p-aminophenylsilane, allyl trimethoxysilane, n-(2-aminoethyl)-3-aminopropyl trimethoxysilane, 3-amine propyl triethoxysilane, 3-aminopropyl trimethoxysilane, 3-glycidoxypropyl diisopropyl ethoxysilane, (3-glycidoxypropyl)methyl diethoxysilane, 3-mercaptopropyl trimethoxysilane, 3-mercaptopropyl triethoxysilane, 3-methacryloxypropylmethyl diethoxysilane, 3-methacryloxypropylmethyl dimethoxysilane, 3-methacryloxypropyl trimethoxysilane, n-phenylaminopropyl trimethoxysilane, vinylmethyl diethoxysilane, vinyl triethoxysilane, vinyl trimethoxysilane, and a mixture thereof.

In another example, the intermediate layer can be produced by polymerizing one or more polyfunctional acrylates. As the kind of the polyfunctional acrylate, for example, bifunctional acrylates such as 1,4-butanediol di(meth)acrylate, 1,6-hexanediol di(meth)acrylate, neopentyl glycol di(meth)acrylate, polyethylene glycol di(meth)acrylate, neopentylglycol adipate di(meth)acrylate, hydroxypivalic acid neopentyl glycol di(meth)acrylate, dicyclopentanyl di(meth)acrylate, caprolactone modified dicyclopentenyl di(meth)acrylate, ethylene oxide modified di(meth)acrylate, di(meth)acryloxyethyl isocyanurate, allylated cyclohexyl di(meth)acrylate, tricyclodecane dimethanol (meth)acrylate, dimethylol dicyclopentane di(meth)acrylate, ethylene oxide modified hexahydrophthalic acid di(meth)acrylate, neopentyl glycol modified trimethylpropane di(meth)acrylate, adamantane di(meth)acrylate or 9,9-bis[4-(2-acryloyloxyethoxy)phenyl]fluorene; trifunctional acrylates such as trimethylolpropane tri(meth)acrylate, dipentaerythritol tri(meth)acrylate, propionic acid modified dipentaerythritol tri(meth)acrylate, pentaerythritol tri(meth)acrylate, propylene oxide modified trimethylolpropane tri(meth)acrylate, trifunctional urethane (meth)acrylate or tris (meth)acryloxyethyl isocyanurate; tetrafunctional acrylates such as diglycerin tetra(meth)acrylate or pentaerythritol tetra(meth)acrylate; pentafunctional acrylates such as propionic acid modified dipentaerythritol penta(meth)acrylate; and hexafunctional acrylates such as dipentaerythritol hexa(meth)acrylate, caprolactone modified dipentaerythritol hexa(meth)acrylate or urethane (meth)acrylate (e.g. a reaction product of an isocyanate monomer and trimethylolpropane tri(meth)acrylate), and the like can be used, without being limited thereto.

In one example, the intermediate layer can comprise a fluorine-based compound. For example, a fluorine-based (meth)acrylate or a fluorine-based siloxane compound can be used. Although not particularly limited, a perfluoro compound such as perfluoropolyether acrylate can be used as the fluorine-based (meth)acrylate, and an alkoxysilane compound substituted with a fluorine-containing chain can be used as the fluorine-based siloxane compound.

As the epoxy resin applicable to the formation of the intermediate layer, at least one selected from the group consisting of an alicyclic epoxy resin and an aromatic epoxy resin can be used.

As the alicyclic epoxy resin, for example, at least one selected from the group consisting of an alicyclic glycidyl ether type epoxy resin and an alicyclic glycidyl ester type epoxy resin can be used. Also, for example, 3,4-epoxycyclohexyl-methyl-3,4-epoxy cyclohexane carboxylate, which is Celloxide 2021P (Daicel Co.), and derivatives thereof can be used, which are stable even at high temperatures, colorless and transparent, and have excellent toughness, adhesion and adhesiveness for lamination. Especially, when used for coating, they have excellent surface hardness.

As the aromatic epoxy resin, for example, at least one aromatic epoxy resin selected from the group consisting of a bisphenol A type epoxy resin, a brominated bisphenol A type epoxy resin, a bisphenol F type epoxy resin, a bisphenol AD type epoxy resin, a fluorene-containing epoxy resin and triglycidyl isocyanurate can also be used.

The intermediate layer can be, for example, a coating layer formed by a sol-gel reaction. For example, at least one selected from the group consisting of SiOx (where, x is an integer of 1 to 4), SiOxNy (where, x and y are each an integer of 1 to 3), $Al_2O_3$, $TiO_2$, ZrO and ITO can also be included in the intermediate layer.

The intermediate layer can also comprise a metal alkoxide of Formula 3 below, or a condensation product thereof:

Formula 3

In Formula 3, M can be any one metal selected from the group consisting of aluminum, zirconium, and titanium, $R_3$ can be halogen, an alkyl group, an alkoxy group, an acyloxy group, or a hydroxy group, and z can be 3 or 4.

In one example, the intermediate layer can further comprise a filler. The filler can be used in consideration of, for example, adjusting the refractive index of the intermediate layer and/or adjusting the mechanical strength, and the like. In one example, as the filler, at least one selected from the group consisting of CaO, $CaF_2$, MgO, $ZrO_2$, $TiO_2$, $SiO_2$, $In_2O_3$, $SnO_2$, $CeO_2$, BaO, $Ga_2O_3$, ZnO, $Sb_2O_3$, NiO and $Al_2O_3$ can be used.

The method of forming the intermediate layer using the above materials is not particularly limited and known methods, for example, various dry and/or wet coating methods such as a deposition method and a sol-gel coating method, can be used depending on the materials to be used.

The thickness of the intermediate layer is not particularly limited. For example, it can be 50 μm or less. Specifically, the upper limit of the thickness can be 40 μm or less, 30 μm or less, 20 μm or less, 10 μm or less, or 5 μm or less, and the lower limit can be 0.5 μm or more, or 1 μm or more.

In one example, the intermediate layer can be a layer that provides a flat surface on which an inorganic layer can be formed. That is, the intermediate layer can be a planarizing layer. The planarizing layer can be a layer that average surface roughness (Rt) of one surface opposite to a surface facing a base layer, that is, a surface on which an inorganic layer is formed, is in a range of 15 to 45 nm. The surface roughness of the intermediate layer means an average value for the height difference between the highest part and the lowest part in a predetermined region having roughness, which can be measured in the same manner as described in the following experimental example.

In one example, the first region of the inorganic layer can have a thickness of at least twice or more relative to the average surface roughness (Rt) of the planarizing layer. For example, when the average surface roughness (Rt) of the planarizing layer is 20 nm, the thickness of the first region can be 40 nm or more, and in another example, when the average surface roughness (Rt) of the planarizing layer is 30 nm, the thickness of the first region can be 60 nm or more. When the planarizing layer and the first region satisfy the thickness relationship in the barrier film, the inorganic layer can be stably formed. Then, the stably formed inorganic layer can provide an excellent water vapor transmission rate without being damaged even if stored for a long time at high temperature/high humidity conditions. Although not particularly limited, in general, when the planarizing layer of the composition is formed, it can be preferable that the thickness of the first region is about 60 nm or more, 65 nm or more, 70 nm or more, or 75 nm or more, considering that the surface roughness formed on one surface thereof is about 20 nm or more, 25 nm or more or 30 nm or more. At this time, the upper limit of the thickness of the first region can also be, for example, in the range of 300 nm.

The barrier film can be produced according to a predetermined method.

For example, the method for producing a barrier film can comprise steps of: applying a polysilazane composition on an adherend for coating including a base layer; and performing a plasma treatment on the polysilazane layer formed on the adherend for coating. The production method will be described in detail as follows.

The plasma treatment is performed by generating plasma under an atmosphere containing a plasma generation gas such as Ar and injecting positive ions in the plasma to the polysilazane layer, where the plasma can be generated, for example, by an external electric field or a negative high voltage pulse. This plasma treatment can be performed using a known apparatus.

The plasma treatment can be performed under the following conditions.

In one example, the plasma treatment can be performed by a method of adjusting a distance of a plasma treatment object from an electrode. At this time, the plasma treatment object can mean a laminate in a state where a polysilazane composition is coated on an adherend for coating (for example, a base layer), or a laminate in a state where a polysilazane layer is formed through a predetermined warming (heating) state of the composition applied to the adherend for coating. Such a laminate can be referred to as a barrier film precursor. For example, upon the plasma treatment, the distance of the barrier film precursor from the electrode (positive and/or negative electrode) can be adjusted to 150 mm or less. It is believed that the closer the distance between the precursor sample and the positive electrode is in the range that satisfies the above distance, plasma energy can be transferred to the barrier film precursor while reducing the loss of plasma energy and the possibility of polysilazane modification can be increased while thermal energy generated upon plasma discharge is effectively transferred to the precursor. For example, the distance can be 140 mm or less, 130 mm or less, 120 mm or less, 110 mm or less, 100 mm or less, 90 mm or less, or 80 mm or less. The lower limit of the distance is not particularly limited, but if the distance between the negative electrode and the barrier film precursor is too close, there is a possibility of damage to the base layer, and thus for example, the lower limit of the distance can be 15 mm or more, or 20 mm or more.

In one example, the plasma treatment can be performed under a predetermined power density. Specifically, upon the plasma treatment, the power density per unit area of the electrode can be about 0.05 $W/cm^2$ or 0.10 $W/cm^2$ or more. In another example, the power density can be about 0.2 $W/cm^2$ or more, about 0.3 $W/cm^2$ or more, about 0.4 $W/cm^2$ or more, about 0.5 $W/cm^2$ or more, about 0.6 $W/cm^2$ or more, about 0.7 $W/cm^2$ or more, about 0.8 $W/cm^2$ or more, or about 0.9 $W/cm^2$ or more. Within the range that satisfies the power density, in the case of the positive electrode, the higher the power density, the degree of plasma treatment can be increased for a short time and the degree of modification of the polysilazane due to application of a high voltage can be increased. In the case of the negative electrode, the excessively high power density can cause damage to the base layer due to a high voltage, and thus considering this point, the upper limit of the power density can be about 2 $W/cm^2$ or less, 1.5 $W/cm^2$ or less, or 1.0 $W/cm^2$ or less.

In one example, in the case of having the power density, the processing energy upon the plasma treatment, which is determined by multiplying the power density by the processing time, can be 50 $J/cm^2$ or less. Specifically, the energy can be 45 $J/cm^2$ or less, 40 $J/cm^2$ or less, 35 $J/cm^2$ or less, 30 $J/cm^2$ or less, 25 $J/cm^2$ or less, 20 $J/cm^2$ or less, and the lower limit can be 5 $J/cm^2$ or more, 10 $J/cm^2$ or more, or 15 $J/cm^2$ or more.

In one example, the plasma treatment can be performed under a predetermined process pressure. Specifically, the process pressure upon the plasma treatment can be 350 mTorr or less. In the case of the positive electrode, the lower the process pressure, the easier the average free path is secured, and thus the plasma treatment can be performed without energy loss due to collision with gas molecules. For example, the process pressure can be 340 mTorr or less, 330 mTorr or less, 320 mTorr or less, 310 mTorr or less, 300 mTorr or less, 290 mTorr or less, 280 mTorr or less, 270 mTorr or less, 260 mTorr or less, 250 mTorr or less, 240 mTorr or less, 230 mTorr or less, 220 mTorr or less, 210 mTorr or less, or 200 mTorr or less. On the other hand, in the case of the negative electrode, the lower the process pressure is, the less the gas molecules are, and thus high voltage and power can be required to generate the plasma, where the high voltage and the high power can cause damage to the base layer, and for example, the lower limit can be 50 mTorr or more, 60 mTorr or more, 70 mTorr or more, 80 mTorr or more, 90 mTorr or more, 100 mTorr or more, 110 mTorr or more, 120 mTorr or more, 130 mTorr or more, 140 mTorr or more, 150 mTorr or more, 160 mTorr or more, 170 mTorr or more, 180 mTorr or more, or 190 mTorr or more. The pressure can be a pressure at the beginning of the process and the pressure can be maintained within the range during the process.

In one example, the plasma treatment can be performed while adjusting the type and flow rate of process gases. Specifically, the plasma treatment can be performed while injecting water vapor, discharge gas (Ar) and oxygen into the processing space. When the plasma treatment is performed under such a process gas atmosphere, it is believed that the hydrogen radicals dissociated from the water vapor in the processing space remove hydrogen elements of the polysilazane and combine to form hydrogen ($H_2$), whereby the reactivity of the polysilazane can increase, and as a result, the barrier properties can be improved.

When water vapor, discharge gas and oxygen are used as process gases, the vapor pressure of water vapor in the processing space can be 5% or more. The water vapor pressure is the percentage of the injection flow rate of the injected water vapor, relative to the total flow rate of the gases injected into the processing space, where in the case of performing the plasma treatment while injecting water vapor, a discharge gas and a reaction gas at flow rates of A sccm, B sccm and C sccm, respectively, the water vapor pressure can be calculated as $100\% \times A/(A+B+C)$. In another example, the water vapor pressure can be about 10% or more, about 15% or more, about 20% or more, about 25% or more, or about 30% or more. The upper limit of the water vapor pressure is not particularly limited and can be, for example, about 90% or less, about 85% or less, about 80% or less, about 75% or less, about 70% or less, about 65% or less, about 60% or less, about 55% or less, about 50% or less, about 45% or less, about 40% or less, or about 35% or less.

In order to maintain the water vapor pressure to the above level, the plasma treatment can be performed while introducing water vapor having a predetermined flow rate or more into the space. For example, the modification treatment can be performed while injecting the water vapor at a flow rate of 50 sccm or more in the processing space. In another example, the injection flow rate of the water vapor can be 60 sccm or more, 70 sccm or more, 80 sccm or more, 90 sccm or more, 100 sccm or more, 110 sccm or more, or 120 sccm or more. The upper limit of the injection flow rate is not particularly limited, and for example, the injection flow rate can be about 500 sccm or less, 400 sccm or less, 300 sccm or less, 200 sccm or less, or about 150 sccm or less.

The hydrogen partial pressure in the processing space can be controlled by maintaining the water vapor pressure as above.

When the type and vapor pressure of the process gas are adjusted as above, dehydrogenation of the polysilazane layer can be performed by hydrogen radicals generated from water vapor, thereby adjusting the partial pressure of hydrogen in the processing space. For example, the partial pressure of hydrogen ($H_2$) in the processing space can range from about $2.00 \times 10^{-5}$ Pa to $1.00 \times 10^{-4}$ Pa.

In one example, with respect to plasma processing conditions, the injection flow rates of discharge gas and water vapor can be adjusted. Specifically, the ratio (H/N) of the injection flow rate (H) of the water vapor to the injection flow rate (N) of the discharge gas for the processing space can be maintained at 0.4 or more. In another example, the ratio (H/N) can be maintained at about 0.45 or more or about 0.5 or more. The upper limit of the ratio (H/N) is not particularly limited and can be, for example, about 5 or less, about 4 or less, about 3 or less, about 2 or less, about 1 or less, or about 0.9 or less. Under such a range, the modification treatment can be effectively performed.

In one example, with respect to plasma processing conditions, the injection flow rates of water vapor and oxygen can be adjusted. Specifically, the ratio (H/O) of the injection flow rate (H) of the water vapor to the injection flow rate (O) of the oxygen gas for the processing space can be 0.4 or more. In another example, the ratio (H/O) can be maintained at about 0.45 or more, or about 0.5 or more. The upper limit of the ratio (H/O) is not particularly limited and can be, for example, about 5 or less, about 4 or less, about 3 or less, about 2 or less, about 1 or less, or about 0.9 or less. Under such a range, the modification treatment can be effectively performed.

The temperature at which the plasma treatment is performed is not particularly limited, but if the temperature increases, the reaction for forming the barrier layer can be made smoother, whereby it can be appropriate to perform the treatment above room temperature. For example, the process temperature during the modification treatment can be 30° C. or higher, 40° C. or higher, 50° C. or higher, 60° C. or higher, 70° C. or higher, or 80° C. or higher. In another example, the process temperature can be about 85° C. or higher, about 90° C. or higher, about 95° C. or higher, about 100° C. or higher, about 105° C. or higher, or about 110° C. or higher. The process temperature can be maintained at about 200° C. or lower, about 190° C. or lower, about 180° C. or lower, about 170° C. or lower, about 160° C. or lower, about 150° C. or lower, about 140° C. or lower, about 130° C. or lower, or about 120° C. or lower.

The plasma treatment time can be appropriately adjusted at a level that does not hinder the barrier properties of the film. For example, the plasma treatment can be performed for a time of about 10 seconds to 10 minutes.

The polysilazane layer formed on the adherend for coating can be modified through the plasma treatment under the above conditions, whereby the properties of the barrier film described above can be imparted. For example, upon the formation of the inorganic layer, the polysilazane undergoes a dehydrogenation crosslinking reaction or a silica formation reaction, where it is believed that if the first region adjacent to the base layer in the inorganic layer or the intermediate layer described below is formed, residual moisture or oxygen is supplied from the organic portion derived from the base layer or the intermediate layer, so that silica formation occurs predominantly. In addition, upon the formation of the second region, the supply of residual moisture, oxygen, etc. derived from the base layer or the intermediate layer is limited by the first region already formed, so that it is believed that the nitrogen content increases as the dehydrogenation crosslinking reaction progresses considerably. Then, it is believed that the compactness is given to the inorganic layer having such elemental contents (distribution).

In one example, the method for producing a barrier film can further comprise a heating step for the film precursor before performing the plasma treatment. The heating can be performed, for example, in the range of 40 to 150° C. for several minutes to several hours. After the solvent is evaporated through the heating, the plasma treatment can be performed.

The barrier film of the present application formed by such a manner has excellent barrier properties, so that it can be used in various applications such as packaging materials of foods, drugs or the like, members for FPDs (flat panel displays) such as LCDs (liquid crystal displays) or solar cells, substrates for electronic papers or OLEDs (organic light emitting diodes) or sealing films. Particularly, the barrier film formed in the above-described manner has excellent optical performances such as transparency and thus can be effectively used in optical devices such as various display devices or lighting devices.

When it is used for such a use, the lamination order of the barrier film and the optical device is not particularly limited.

For example, the barrier film can be positioned such that its second region is adjacent to an object to be protected, i.e., a configuration vulnerable to moisture. Specifically, when the barrier film is attached to an OLED element, the lamination order can be the base layer, the first region, the second region, and the OLED element. At this time, the second region can be formed directly on the OLED or be adjacent to the OLED via another layer configuration.

In another example, the first region can be located to be adjacent to an object to be protected, i.e., a configuration vulnerable to moisture. Specifically, when the barrier film is attached to the OLED element, the lamination order can be the OLED, the first region, and the second region. At this time, the first region can be formed directly on the OLED or be adjacent to the OLED via another layer configuration.

In another example of the present application, the present application relates to an electrical or electronic element. These elements can comprise a barrier film having the same configuration or properties as described above.

In yet another example of the present application, the present application relates to a method for producing a barrier film. The method can comprise steps of applying a polysilazane composition on a base layer and subjecting it to a plasma treatment.

Specific features and configurations of the base layer and the polysilazane composition are as described above.

In addition, the above-described contents can also be equally applied to the plasma treatment method for forming an inorganic layer.

Advantageous Effects

According to one example of the present application, a barrier film having excellent barrier properties and light transmittance can be provided.

EXAMPLES

Hereinafter, the barrier film of the present application will be described through examples according to the present application and comparative examples, but the scope of the present application is not limited by the following examples.

Measuring Method

Water vapor transmission rate: Using MOCON Aquatron II, the water vapor transmission rate of the produced barrier film was measured at 38° C. and 100% relative humidity conditions (water vapor transmission rate in Condition 1). Separately, the barrier film was stored at 85° C. and 85% relative humidity conditions for 250 hours, and the water vapor transmission rate of the barrier film was again measured at 38° C. and 100% relative humidity conditions (water vapor transmission rate in Condition 2).

Etching rate and elemental content analysis: The element distribution analysis in the depth (thickness) direction from the surface of the inorganic material layer to the base material direction was performed while gradually removing the inorganic layer using Ar ions. As the etching conditions, an Ar ion setting with an etching rate of 0.09 nm/s for $Ta_2O_5$ as the reference material was used. In addition, the elemental contents of the inorganic layer were analyzed using XPS (X-ray photoelectron spectroscopy) (C can be detected as an impurity derived from the base material).

Experimental Example 1

The thickness, etching rate, and water vapor transmission rate (Condition 1) of the barrier film produced as described below were measured, and the results were described in Table 1.

Example 1

A planarizing layer having a thickness of 1 μm was laminated on a PET (poly(ethylene terephthalate)) film (a product from Teijin Co., Ltd.) having a thickness of about 50 μm, and an inorganic material layer was formed on the planarizing layer. The specific process is as follows.

Formation of planarizing layer: A composition comprising 2 ratios by weight of a photocuring initiator to a mixture of fluorene acrylate HR6060:PETA (pentaerythritol triacrylate):DPHA (dipentaerythritol hexaacrylate) in a content (weight) ratio of 80:10:10 was diluted in PGME (propylene glycol methyl ether) to 25% to prepare a coating liquid for a planarizing layer. The coating liquid was applied onto a PET film as a base material using a Mayer bar, and dried at 100° C. for 5 minutes. Subsequently, the coating layer was irradiated with ultraviolet rays at 0.6 J/cm² by a mercury lamp, and cured to form a planarizing layer.

Formation of inorganic coating layer (1): Polysilazane was diluted to 3.7% with Merck's NL grade dibutyether, coated on the planarizing layer using a Mayer bar, and then dried at 100° C. for 5 minutes. A plasma treatment was performed on the polysilazane coating layer under the following conditions, and an inorganic coating layer was formed. Regarding the concentration of the diluted polysilazane, % means the weight ratio of the total solid content.

Pressure 250 mTorr (flow rate on the basis of sccm atmosphere of $Ar:O_2:H_2O=1.5:1:1$)

Distance between polysilazane coated surface and electrode 25 mm

Power density: supply of DC power 0.8 W/cm² for 25 seconds

Example 2

On the inorganic coating layer (1) manufactured in Example 1, a polysilazane layer was further formed by using a coating liquid having a silazane concentration of 1%, and the plasma treatment was performed under the same conditions as in Example 1 to further laminate an inorganic coating layer (2).

Example 3

On the inorganic coating layer (1) manufactured in Example 1, a polysilazane layer was further formed by using a coating liquid having a silazane concentration of 2.4%, and the plasma treatment was performed under the same conditions as in Example 1 to further laminate an inorganic coating layer (2-1).

Example 4

On the inorganic coating layer (1) manufactured in Example 1, a polysilazane layer was further formed by using a coating liquid having a silazane concentration of 3.7%, and the plasma treatment was performed under the same conditions as in Example 1 to further laminate an inorganic coating layer (2-2).

Example 5

A barrier film comprising a base layer/a planarizing layer/an inorganic coating layer (1-1) was produced in the same method as in Example 1, except that upon producing the inorganic coating layer, a coating liquid having a silazane concentration of 2.4% was applied on the planarizing layer and the plasma treatment conditions were changed as follows. Thereafter, a coating liquid having a silazane concentration of 2.4% was applied onto the inorganic coating layer (1-1), and the plasma treatment was performed under the following conditions to produce a barrier film comprising the base layer/the planarizing layer/the inorganic coating layer (1-1)/the inorganic coating layer (2-3).

Pressure 150 mTorr (flow rate on the basis of sccm atmosphere of $Ar:O_2:H_2O=1.5:1:1$)

Distance between polysilazane coated surface and electrode 40 mm

Power density: supply of DC power 0.45 W/cm² for 45 seconds

Comparative Example 1

A barrier film was produced in the same manner as in Example 1, except that the polysilazane solution diluted to 4.5% was used and the plasma conditions were changed as follows.

Pressure 100 mTorr (flow rate on the basis of sccm atmosphere of $Ar:O_2=1:1$)

Distance between polysilazane coated surface and electrode 10 mm

Power density: supply of DC power 0.3 W/cm² for 65 seconds

Comparative Example 2

A barrier film was produced in the same method as in Comparative Example 1, except that the polysilazane solution diluted to 4.9% was used and the distance from the electrode was 175 mm.

TABLE 1

|  |  | Inorganic layer (first region + second region) | | | Second region | | Water vapor transmission rate |
|---|---|---|---|---|---|---|---|
|  |  | Thickness (nm) | Etching time (s) | Etching rate (nm/s) | Etching time (s) | Thickness (nm) | under Condition 1 ($\times 10^{-4}$ g/m²·day) |
| Example | 1 | 150 | 925 | 0.162 | 105 | 17 | 7.0 |
|  | 2 | 185 | 1,180 | 0.157 | 380 | 57 | 2.3 |
|  | 3 | 215 | 1,310 | 0.164 | 540 | 86 | <0.5 |
|  | 4 | 250 | 1,600 | 0.156 | 800 | 125 | <0.5 |
|  | 5 | 165 | 1,000 | 0.165 | 630 | 100 | <0.5 |
| Comparative | 1 | 180 | 700 | 0.257 | 180 | 46 | 23.9 |
| Example | 2 | 200 | 760 | 0.263 | 130 | 34 | 12.0 |

* The thickness of the second region was obtained by multiplying 'the etching time for the second region distinguished through the XPS analyses' and 'the etching rate for the inorganic layer.'

As in Table 1, it can be seen that Examples comprising the inorganic layer satisfying an etching rate of 0.17 nm/s or less have very low water vapor transmission rates relative to Comparative Examples which do not satisfy the etching rate. In particular, in can be confirmed that in the case of Example 1 of the present application, the thickness of the inorganic layer is thinner than those of Comparative Examples, but the excellent water vapor transmission rate can be ensured. This means that the inorganic layers of the barrier films in Examples are denser than the inorganic layers of the barrier films in Comparative Examples. In addition, the 4.9% silazane solution was used when forming the barrier film of Comparative Example 2 and the 2.4% silazane solution was used twice when forming the barrier film of Example 5, whereby the concentrations of the silazane solutions were almost similar (the concentration of Comparative Example was higher), but it can be seen that the difference in water vapor transmission rate occurred. This suggests that the compactness of the film is not due to the concentration of the coating solution.

Under the premise that they have similar compactness degrees, it is common that if the thickness of the layer increases, the barrier properties to gas or moisture increase (see water vapor transmission rates of Comparative Examples 1 and 2). In this regard, comparing Example 2 with Example 5, it can be seen that the water vapor transmission rate of Example 5 having a lower thickness is lower. This is because the thickness of the second region, which is a high nitrogen concentration region, is larger in the film of Example 5. This is also confirmed when comparing the thicknesses of the second regions of Examples 1 to 5. That is, like the etching rate for the reference conditions is 0.17 nm/s or less, it can be confirmed that under the premise that the compactness of the inorganic layer identified through the etching rate is ensured, the thicker the second region, which is a high nitrogen concentration region, the water vapor transmission rate is improved.

On the other hand, the second regions of the films in Examples 3 and 5 have been formed equally from the 2.4% silazane solution, but the second regions have different thicknesses. That is, by appropriately adjusting the above-mentioned conditions upon the plasma treatment, the thickness of the second region, which is a high nitrogen concentration region, can be increased and the water vapor transmission rate of the barrier film can be more improved.

Experimental Example 2

The thickness, etching rate, and water vapor transmission rate (Condition 1 and Condition 2) of the barrier film prepared as produced below were measured, and the results were described in Tables 2 and 3.

Example 6

A planarizing layer having a thickness of 1 μm was laminated on a PET (poly(ethylene terephthalate)) film (a product from Teijin Co., Ltd.) having a thickness of about 50 and an inorganic material layer was formed on the planarizing layer. The specific process is as follows.

Formation of planarizing layer: A composition comprising 2 ratios by weight of a photocuring initiator to a mixture of fluorine based fluorene acrylate HR6060:PETA (pentaerythritol triacrylate):DPHA (dipentaerythritol hexaacrylate) in a content (weight) ratio of 80:10:10 was diluted in PGME (propylene glycol methyl ether) to 25% to prepare a coating liquid for a planarizing layer. The coating liquid was applied onto a PET film as a base material using a Mayer bar, and dried at 100° C. for 5 minutes. Subsequently, the coating layer was irradiated with ultraviolet rays at 0.6 J/cm$^2$ by a metal lamp, and cured to form a planarizing layer. 10 different regions having an area of about 100 μm$^2$ of the surface of the planarizing layer were designated, and the height difference between the highest part and the lowest part in each region was obtained by using Optical Profiler, and an average surface roughness value (Rt) of 34 nm (standard deviation 5.8 nm) was obtained.

Formation of inorganic coating layer (1'): Polysilazane was diluted to 3.7% with Merck's NL grade dibutylether, coated on the planarizing layer using a Mayer bar, and then dried at 100° C. for 5 minutes. A plasma treatment was performed on the polysilazane coating layer under the following conditions, and an inorganic coating layer was formed.

Pressure 250 mTorr (flow rate on the basis of sccm atmosphere of Ar:O$_2$:H$_2$O=1.5:1:1)

Distance between polysilazane coated surface and electrode 25 mm

Power density: supply of DC power 0.8 W/cm$^2$ for 25 seconds

Formation of inorganic coating layer (2'): On the inorganic layer (1'), a polysilazane layer was further formed by using a coating liquid having a silazane concentration of 3.7%, and the plasma treatment was performed under the same conditions as in the formation of the inorganic coating layer (1') to further laminate an inorganic coating layer (2').

Example 7

A barrier film was produced in the same method as in Example 6, except that the concentrations of silazane used upon forming the inorganic coating layer (1'-1) and the inorganic coating layer (2'-1) were both 2.4%.

Reference Example 1

A barrier film was produced in the same method as in Example 6, except that the concentrations of silazane used upon forming the inorganic layer (1'-2) and the inorganic layer (2'-2) were 1.1% and 3.7%, respectively.

Reference Example 2

A barrier film was produced in the same method as in Example 6, except that the concentrations of silazane used upon forming the inorganic layer (1'-3) and the inorganic layer (2'-3) were 1.8% and 3.1%, respectively.

TABLE 2

| | Inorganic layer (first region + second region) | | | First region | | Water vapor transmission rate | |
|---|---|---|---|---|---|---|---|
| | Thickness (nm) | Etching time (s) | Etching rate (nm/s) | Etching time (s) | Thickness (nm) | ($\times 10^{-4}$ g/m$^2$ · day) | |
| | | | | | | Condition 1 | Condition 2 |
| Example 6 | 250 | 1,600 | 0.156 | 800 | 125 | <0.5 | <0.5 |
| Reference Example 1 | 150 | 950 | 0.158 | 220 | 35 | 0.8 | 44 |

* The thickness of the first region was obtained by multiplying 'the etching time performed until the interface between the first region and the second region distinguished through the XPS analyses appeared' and 'the etching rate for the inorganic layer.'

TABLE 3

| | Inorganic layer (first region + second region) | | First region | Water vapor transmission rate ($\times 10^{-4}$ g/m$^2$·day) | |
|---|---|---|---|---|---|
| | Thickness (nm) | Etching rate (nm/s) | Thickness (nm) | Condition 1 | Condition 2 |
| Example 7 | 170 | <0.17 nm/s | 78 | <0.5 | 4.4 |
| Reference Example 2 | 160 | <0.17 nm/s | 50 | 1.1 | 53 |

The barrier films of Examples 6 and 7 have each a first region having a thickness of twice or more relative to 34 nm which is the surface roughness of the planarizing layer. On the other hand, Reference Example 1 is a barrier film, in which the surface roughness of the planarizing layer and the thickness of the first region are almost similar. Then, the first region of the barrier film in Reference Example 2 has a larger thickness than the surface roughness of the planarizing layer, but its size is less than twice. Inferred from the results of Tables 2 and 3, it is believed that when the first region does not have a thickness of about twice or more the surface roughness of the planarizing layer, the inorganic layer cannot be stably formed even under the plasma treatment, and upon the storage, some of the inorganic layer are damaged and simultaneously, the water vapor transmission rate under Condition 2 becomes poor, as confirmed in Table 2.

Particularly, it can be seen from Example 7 and Reference Example 2 that the total concentrations of the silazane solutions used in forming the inorganic layers are 4.8% and 4.9%, respectively, which are similar, but the difference in water vapor transmission rates (Condition 2) after high temperature/high humidity storage is very large. This means that considering the surface roughness of the planarizing layer, the thickness of the first region formed on the planarizing layer should be sufficiently secured.

The invention claimed is:

1. A barrier film, comprising:
a base layer; and
an inorganic layer including Si, N, and O, and including a first region and a second region, which have different elemental contents (atomic %) of Si, N, and O from each other as measured by XPS,
wherein the film has a water vapor transmission rate of $5.0 \times 10^{-4}$ g/m$^2$·day or less as measured under conditions of a temperature of 38° C. and 100% relative humidity after being stored at 85° C. and 85% relative humidity conditions for 250 hours, and
wherein the inorganic layer has a compactness expressed through an etching rate of 0.17 nm/s or less in the thickness direction for an Ar ion etching condition to etch Ta$_2$O$_5$ at a rate of 0.09 nm/s, and
wherein the second region satisfies the relationship of Si content>N content>O content.

2. The barrier film of claim 1, further comprising a planarizing layer.

3. The barrier film according to claim 1, wherein the first region is in a position closer to the base layer than the second region.

4. The barrier film according to claim 1, wherein the first region satisfies the relationship: O content>Si content>N content.

5. The barrier film according to claim 4, wherein the O content of the first region is in a range of 50 to 65 atomic %, the Si content of the first region is in a range of 35 to 45 atomic %, and the N content of the first region is in a range of 1 to 15 atomic %.

6. The barrier film according to claim 5, wherein the first region has a ratio (a/b) of the O content (a) to the Si content (b) in a range of 1.1 to 1.9.

7. The barrier film according to claim 1, wherein the Si content of the second region is in a range of 45 to 60 atomic %, the N content of the second region is in a range of 20 to 35 atomic %, and the O content of the second region is in a range of 10 to 30 atomic %.

8. The barrier film according to claim 7, wherein the N content in the second region is greater than the N content in the first region.

9. The barrier film according to claim 7, wherein the difference between the highest value of the Si content in the second region and the highest value of the O content in the first region is 15 atomic % or less.

10. The barrier film according to claim 1, wherein the inorganic layer is obtained by plasma-treating polysilazane having a unit of Formula 1 below:

Formula 1 wherein, R$^1$, R$^2$ and R$^3$ are each independently a hydrogen atom, an alkyl group, an alkenyl group, an alkynyl group, an aryl group, an alkylsilyl group, an alkylamino group or an alkoxy group.

11. The barrier film according to claim 2, comprising the base layer, the planarizing layer, and the inorganic layer sequentially,
wherein the planarizing layer has an average surface roughness of the surface facing the inorganic layer in a range of 15 to 45 nm, and
wherein the average surface roughness means an average value for the height difference between the highest part and the lowest part in a predetermined region having roughness and the predetermined region is 10 different designated regions having an area of about 100 μm$^2$ of the surface of the planarizing layer.

12. The barrier film according to claim 11, wherein the first region has a thickness of twice or more the average surface roughness of the planarizing layer.

13. An electrical or electronic element comprising the barrier film according to claim 1.

* * * * *